(12) United States Patent
Paek et al.

(10) Patent No.: US 6,347,821 B1
(45) Date of Patent: Feb. 19, 2002

(54) GRIPPER FOR PICKING APPARATUS OF A MODULE IC HANDLER

(75) Inventors: Seung Joo Paek, Kyungki-do; Do Il Kim, Choongchungnam-do, both of (KR)

(73) Assignee: Mirae Corporation, Chunan-si (KR)

( * ) Notice: Subject to any disclaimer, the term of this patent is extended or adjusted under 35 U.S.C. 154(b) by 0 days.

(21) Appl. No.: 09/495,939

(22) Filed: Feb. 2, 2000

(30) Foreign Application Priority Data

Feb. 2, 1999 (KR) .............................................. 99-1443

(51) Int. Cl.[7] .............................................. B25J 15/02
(52) U.S. Cl. ...................... 294/88; 294/119.1; 294/907; 901/37; 901/49
(58) Field of Search ........................ 294/62, 63.1, 81.6, 294/81.62, 86.4, 87.1, 88, 103.1, 119.1, 907; 29/739, 741; 269/25, 32; 414/416, 730, 741; 901/30–33, 36–39, 49

(56) References Cited

U.S. PATENT DOCUMENTS

| | | | | |
|---|---|---|---|---|
| 3,392,851 A | * | 7/1968 | Pearne et al. | 294/63.1 X |
| 3,700,274 A | * | 10/1972 | Pachal et al. | 294/119.1 X |
| 4,579,380 A | * | 4/1986 | Zaremsky et al. | 294/119.1 |
| 4,638,231 A | * | 1/1987 | Monforte | 294/86.4 X |
| 5,520,501 A | * | 5/1996 | Kouno et al. | 294/119.1 X |
| 6,089,635 A | * | 7/2000 | Lee | 294/88 |

* cited by examiner

Primary Examiner—Johnny D. Cherry
(74) Attorney, Agent, or Firm—Fleshner & Kim, LLP

(57) ABSTRACT

A gripper for the picking apparatus of a module IC handler including a gripper body, first to third supports vertically formed at a lower part of the gripper body, a cylinder for driving a jaw located between first and second supports and second and third supports, a pair of jaws movably connected at a lower part of the cylinder, for picking the module IC, a damping mechanism for reducing an impact occurred upon picking the module IC by the jaw, and a module IC sensor for sensing the module IC upon moving the jaw. The present invention reduces damage of the module ICs with the damping mechanism upon picking the module ICs. Also, the gripper easily and exactly grips the module ICs, thus accomplishing the working performance.

4 Claims, 6 Drawing Sheets

GRIPPER FOR PICKING APPARATUS OF A MODULE IC HANDLER

BACKGROUND OF THE INVENTION

1. Field of the Invention

The present invention relates to a picking apparatus of a module IC (Integrated Circuit) handler used for automatically handling and testing module ICs manufactured throughout test processes for the module ICs, and more particularly to a gripper for the picking apparatus of a module IC handler for picking up the module ICs.

2. Description of the Conventional Art

Typically, a module IC refers to a substrate provided with a substrate whose one side or both sides is used for fixedly mounting a plurality of ICs and electric components, for example, by soldering, and has a function for extending a capacity when it is coupled to a mother substrate.

Such a module IC provides higher added-value when sold, as compared with individual sale of each IC as a final product. For this reason, the IC manufacturers tend to develop it as a main product and sell it.

However, the module IC as a product available from the market is relatively expensive and thus entails higher reliability as an important factor therefor. This requires strict quality tests for passing only products determined to be good, and otherwise, discarding all the module ICs determined to be not good.

The transfer of the module ICs between the processes during the manufacturing of the module IC is done under the state in which the module ICs are contained in the customer tray 101, as shown in FIG. 1, and the module ICs can be safely maintained in the customer tray 101. Also, the customer tray 101 includes a box-typed body 105 having a plurality of partition walls 104.

However, each insertion slot 102 provided inside of the customer tray 101 has much wider width relative to a width of the module IC 103, as shown in FIGS. 1 and 2.

Such a configuration is such that only one kind of a customer tray 101 is used to accommodate various kinds of module ICs 103 whose widths may be different for each kind of module IC, and to maintain the ICs therein.

Further, since the module ICs 103 are available from a package of the customer tray 101 containing the test-finished module ICs therein, the manufacturing cost needs to be reduced.

To produce the customer tray 1 at a low cost, the customer tray is not injection molded, but rather it is vacuum-molded. However, this yields a bad precision to insertion slots 102.

When the module ICs 103 to be tested are accommodated in the customer tray 101, the module ICs 103 are placed in the insertion slots 102 with arbitrarily different inclinations of the ICs 103, as shown in FIG. 2, due to the distinct configuration of the customer tray 101. The distances between the inserted module ICs are different from each other, respectively. Therefore, grippers 108 of the picking apparatus 110, with an interval between the grippers being made constant for each picking apparatus, do not match the above distances.

For this reason, a test tray 106 as shown in FIG. 3 needs to be inevitably employed which is precisely made in order to test the module IC.

As shown in FIG. 5, the gripper 108 includes a jaw 109 which can be movable at both sides of the lower part of a gripper body 111 and has to pick up the test-finished module ICs.

When the jaw 109 of the gripper 108 is to pick up the module ICs 103, a crack may occur by impact due to a collision between the sides of the module ICs 103 and the jaw 109. Thus, there is also a problem that the module ICs leaves and deviates from feeding process.

Also, the jaw 109 of the prior gripper 108 does not maintain a regular tension due to lack of damping means thus resulting in lower efficiency of productivity.

SUMMARY OF THE INVENTION

It is an object of the present invention to provide a gripper for picking apparatus of a module IC handler for picking the test-finished module ICs without impact.

It is another object of the present invention to provide an improved gripper for picking apparatus for picking and moving exactly module ICs twisted with a predetermined angle.

In order to accomplish the above objects, there is provided, the gripper for picking apparatus including: a gripper body; first to third supports vertically formed at lower part of the gripper body; a cylinder for driving a jaw located between first and second supports and second and third supports; a pair of jaws movably connected at a lower part of the cylinder, for picking the module IC; damping means for reducing an impact occurred upon picking the module IC by the jaw; and a module IC sensor for sensing the module IC upon moving the jaw.

BRIFF DESCRIPTION OF THE DRAWINGS

DETAILED DESCRIPTION OF THE INVENTION

Figure 6:
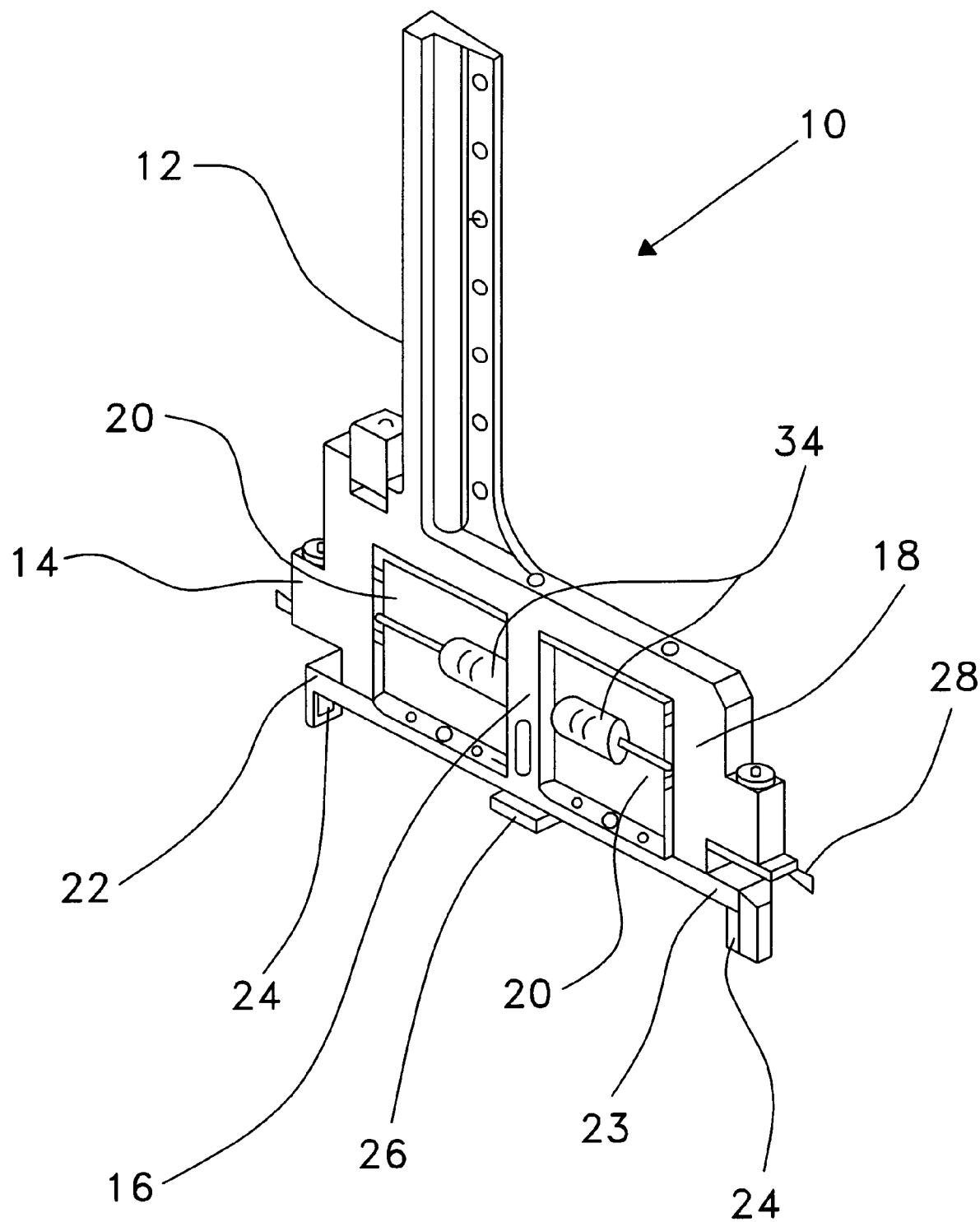
FIG. 6 is a perspective view showing a gripper for picking apparatus of a module IC handler of the present invention.
Figure 7:
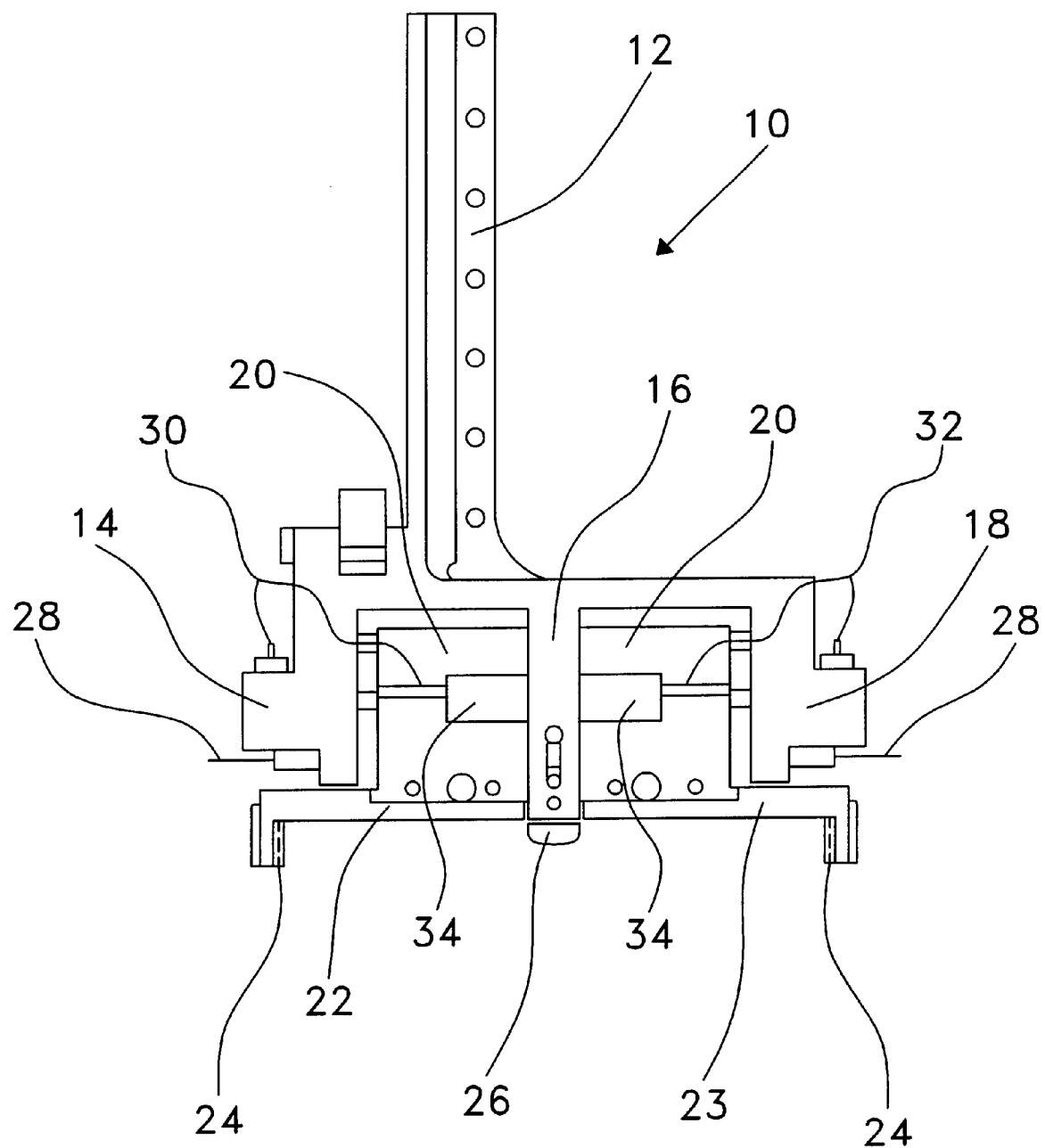
FIG. 7 is a front view of the FIG.6.

Referring to FIGS. 6 and 7, a preferred embodiment of the present invention will be described in detail.

Figure 1:
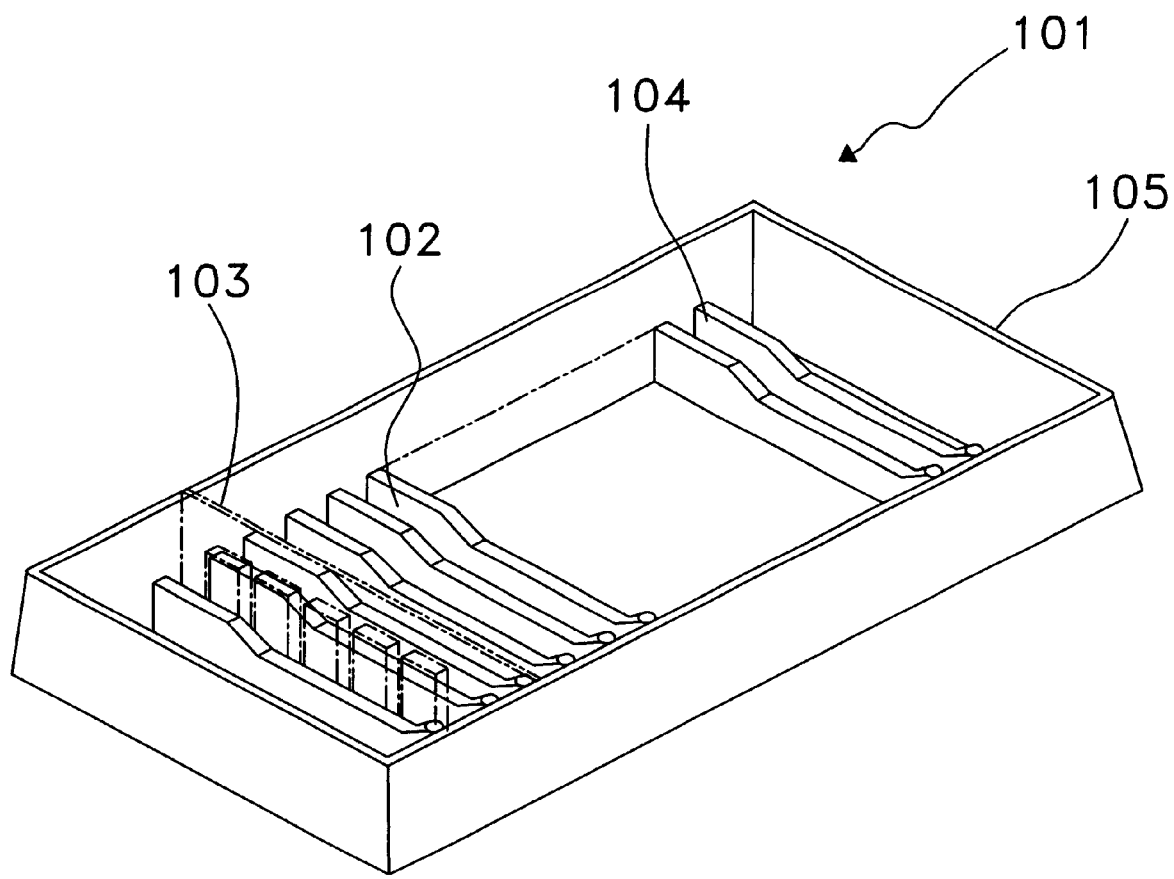
FIG. 1 is a perspective view of a prior customer tray having module ICs.
Figure 2:
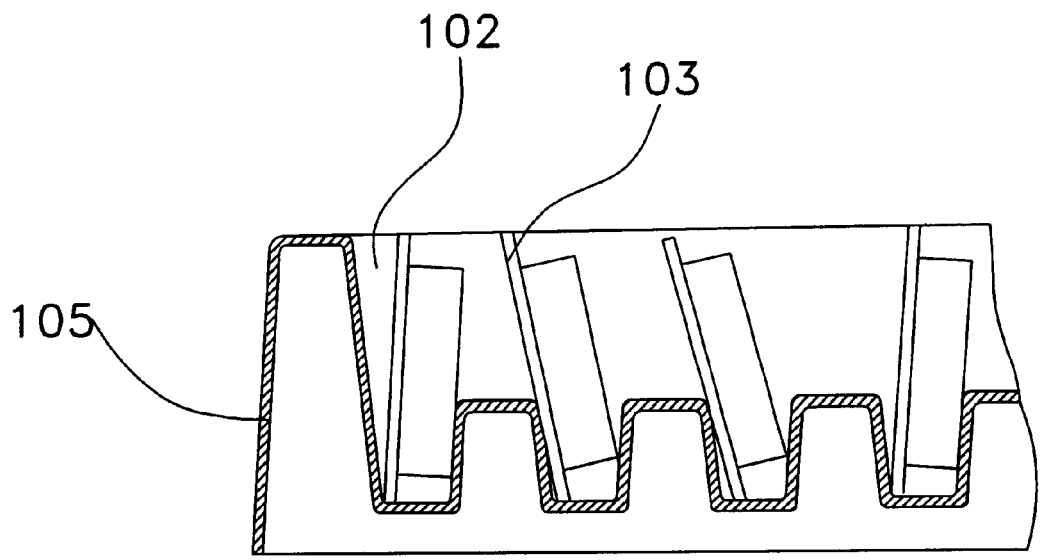
FIG. 2 is a sectional view of a prior customer tray having module ICs.
Figure 3:
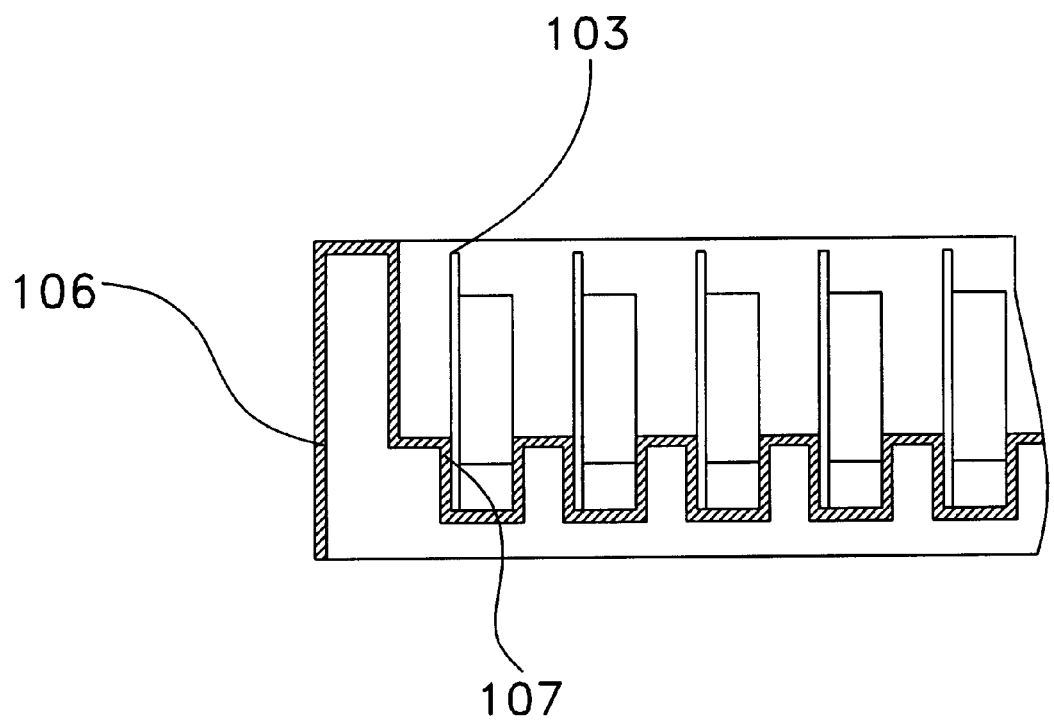
FIG. 3 is a sectional view of a prior test tray having module ICs.
Figure 4:
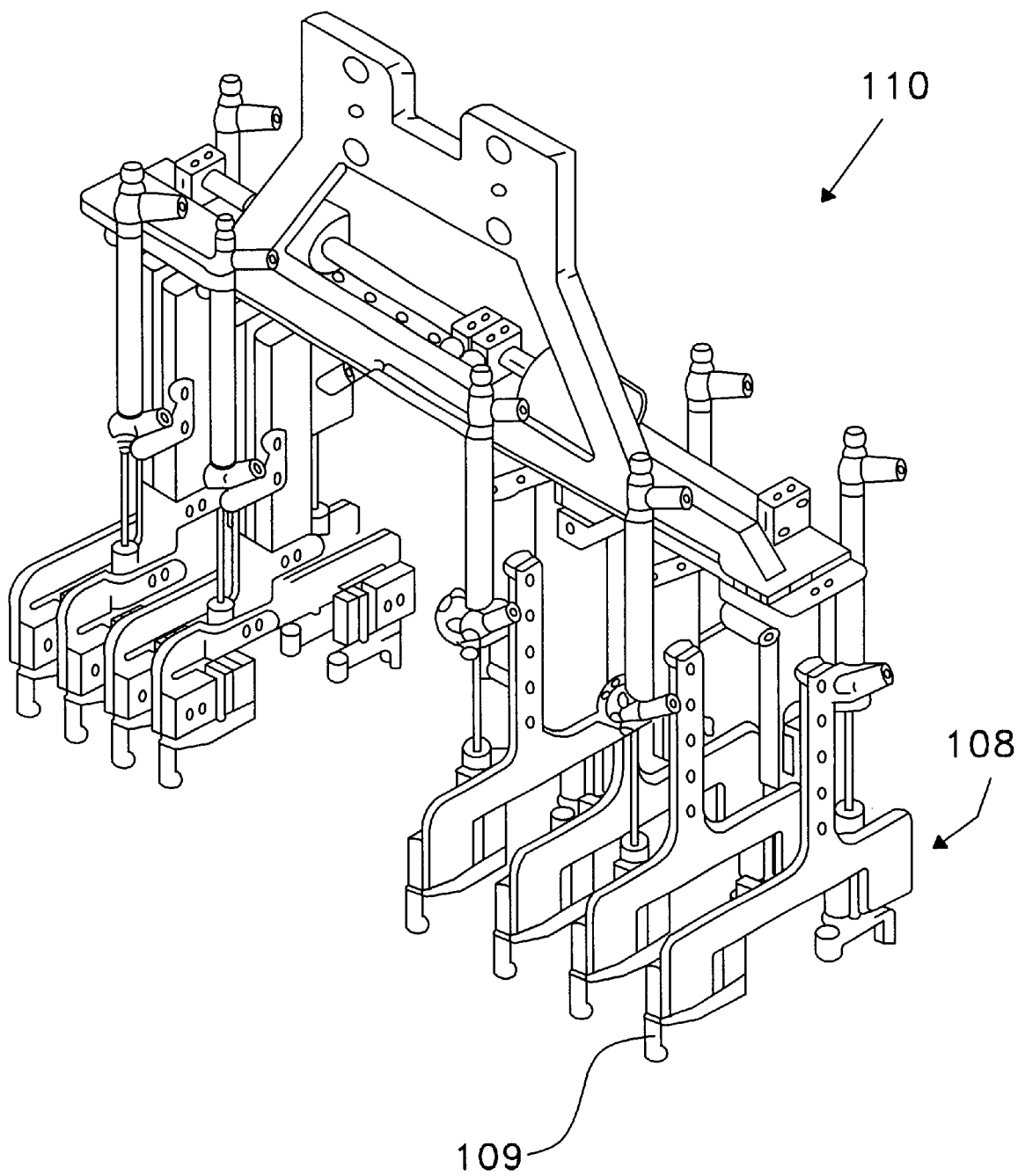
FIG. 4 is a perspective view of a prior picking apparatus for picking the module IC.
Figure 5:
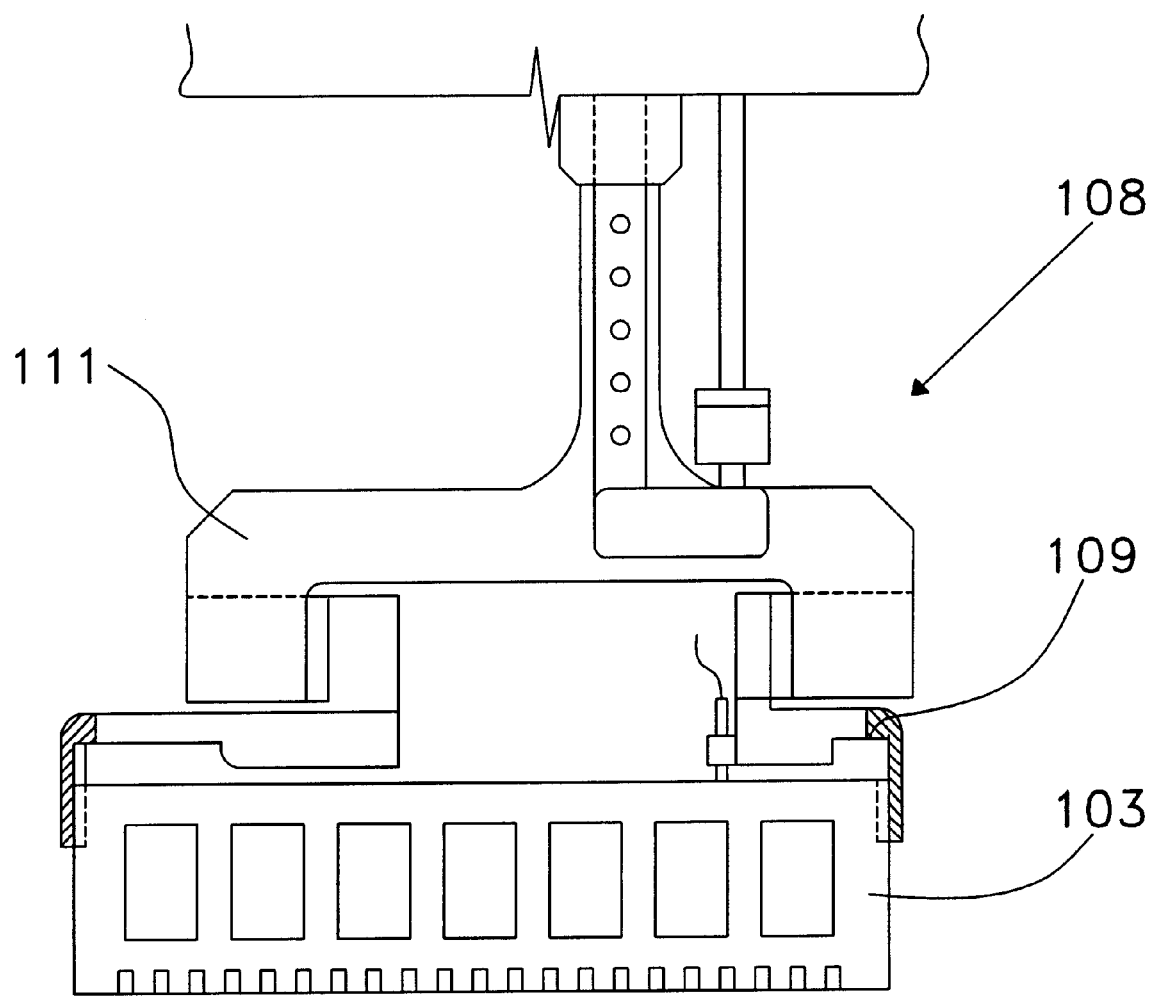
FIG. 5 is a front view showing the state the prior picking apparatus picks up the module IC.

A gripper 10 of the picking apparatus for module IC handler includes a gripper body 12, first to third supports 14, 16, 18 vertically formed at a lower part of the gripper body, cylinder 20 for driving a jaw 22, 23 located between first and second supports 14, 16 and second and third supports 16, 18, a pair of jaws 22, 23 movably connected at a lower part of the cylinder, for picking the module IC 103(referring to FIG.5), damping means 34 mounted at second support 16, for reducing an impact occurred upon picking the module IC 103 by the jaws 22, 23, and a module IC sensor 28 for sensing the module IC 103 upon moving the jaws 22, 23 as shown in FIGS. 6 and 7.

The first and third supports 14, 18 are located at both ends of a lower part of a gripper body 12 of a gripper 108. A second support 16 is provided between the first and third supports 14, 18.

A cylinder 20 for operating jaws 22, 23 is mounted between first and second supports 14, 16 and second and third supports 16, 18. A pair of jaws 22, 23 for picking module IC 103 is movably connected to a lower part of the cylinder 20. And, a dog sensor 26 for sensing an upper part of the module IC 103 is located at a lower part of the second support 16.

A damping means 34 for preventing an impact occurred upon picking the module IC 103 is mounted at a middle part of the second support 16. Also, module IC sensor 28 for sensing the module IC 103 upon moving the jaws 22, 23 is located at both ends of first and third supports 14, 18 so as to pick up the module IC 103 from the customer tray (not shown).

Also, contact plate 24 consisting of elastic materials (that is, rubber, silicon, urethane, etc) is mounted at an inner part of the jaws 22, 23. The gripper 10 is safely and easily gripped due to the contact plate 24 without sliding action upon picking the module IC 103.

Air inlet and outlet lines 32, 30 are provided with both parts of the damping means 34 so as to reduce an impact upon moving the jaws 22, 23 with right and left directions.

When the jaws 22, 23 directly pick up the module ICs 103, air is provided and supplied with the air inlet and outlet lines 32, 30 of the cylinder 20. Therefore, the jaws 22, 23 pick up the module ICs 103 after reducing the impact occurred between the module ICs 103 and jaws 22, 23.

At this time, the jaws 22, 23 easily and safely pick up the module ICs 103 due to the contact plate 24 located at the inner parts of the jaws 22, 23. Also, the jaws can pick up the module ICs 103 by the contact plate 24 upon picking the module ICs to be inclined.

Therefore, the gripper of the present invention is an improvement in an exact picking force by reducing the impact occurred between the jaws and the module ICs.

As described above, the present invention reduces damage of the module ICs so as to reduce the impact by the damping means upon picking the module ICs.

Also, it is possible to safely pick up the module ICs none the less the module ICs with a predetermined angle.

The present invention easily and exactly grips the module IC, thus accomplishing the working performance.

What is claimed is:

1. In a gripper for picking apparatus of a module IC handler for picking module ICs contained in a customer tray, the gripper for picking apparatus comprising:
    a gripper body;
    first to third supports vertically formed at a lower part of the gripper body;
    a cylinder for driving a jaw located between first and second supports and second and third supports;
    a pair of jaws movably connected at a lower part of the cylinder, for picking the module IC;
    damping means for reducing an impact occurred upon picking the module IC by the jaws;
    a module IC sensor for sensing the module IC upon moving the jaws.

2. The gripper for picking apparatus as defined in claim 1, wherein said jaws include a contact plate consisting of rubber and/or urethane material.

3. The gripper for picking apparatus as defined in claim 1, wherein said module IC sensor is located between the first and third supports.

4. The gripper for picking apparatus as defined in claim 1, wherein said gripper further includes a dog sensor for sensing the module IC, the sensor being located at a lower part of the second support.

* * * * *